(12) United States Patent
Miyokawa et al.

(10) Patent No.: US 6,496,524 B2
(45) Date of Patent: Dec. 17, 2002

(54) LASER DIODE MODULE

(75) Inventors: Jun Miyokawa, Ichihara (JP); Hiroshi Kasahara, Yokohama (JP); Yuichiro Irie, Tokyo (JP); Takeo Shimizu, Fujisawa (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 38 days.

(21) Appl. No.: 09/739,695

(22) Filed: Dec. 20, 2000

(65) Prior Publication Data

US 2001/0004369 A1 Jun. 21, 2001

Related U.S. Application Data

(63) Continuation-in-part of application No. PCT/JP00/02414, filed on Apr. 13, 2000.

(30) Foreign Application Priority Data

Apr. 20, 1999 (JP) .......................................... 11-112382

(51) Int. Cl.⁷ ................................................ H01S 3/04
(52) U.S. Cl. ......................................... 372/36; 372/34
(58) Field of Search ............................... 372/36, 34, 6; 385/91, 92

(56) References Cited

U.S. PATENT DOCUMENTS

| | | | |
|---|---|---|---|
| 5,005,178 A | 4/1991 | Kluitmans et al. ............. 372/36 |
| 5,068,865 A | * 11/1991 | Ohshima et al. ............... 372/36 |
| 5,113,404 A | 5/1992 | Gaebe et al. .................. 372/36 |
| 5,264,392 A | 11/1993 | Gaebe et al. .................. 372/50 |
| 5,673,349 A | * 9/1997 | Kosugi ........................ 385/92 |
| 5,706,302 A | * 1/1998 | Shimizu ....................... 372/36 |
| 5,875,204 A | 2/1999 | Sato ............................ 372/34 |
| 6,178,188 B1 | * 1/2001 | Jing et al. .................... 372/36 |

FOREIGN PATENT DOCUMENTS

| | | |
|---|---|---|
| JP | 1-227486 | 9/1989 |
| JP | 07-131112 | 5/1995 |
| JP | 09-021933 | 1/1997 |
| JP | 09-064450 | 3/1997 |
| JP | 10-142456 | 5/1998 |
| JP | 10-213722 | 8/1998 |
| JP | 11-174284 | 7/1999 |
| JP | 2000-124538 | 4/2000 |

\* cited by examiner

Primary Examiner—Quyen Leung
(74) Attorney, Agent, or Firm—Oblon, Spivak, McClelland, Maier & Neustadt, P.C.

(57) ABSTRACT

A laser diode module is provided which is capable of suppressing reduction in the efficiency of laser beam coupling with an optical fiber even in the case where a warp is caused in the mounting surface of a thermo electrical cooler on which a laser diode chip is mounted. A laser diode module has a heat sink and optical coupling portion mounted directly or indirectly on a mounting surface of a thermo electrical cooler. A laser diode chip and the optical coupling portion are located on the same side of the mounting surface along the emitting direction of a laser beam emitted from the laser diode chip, with respect to a first center line ($L_{cpp}$) intersecting perpendicularly with a tangential plane tangent to the mounting surface of the thermo electrical cooler at the center thereof and/or a second center line passing through the center of the mounting surface of the thermo electrical cooler and perpendicular to both the first center line and an axis representative of the emitting direction of the laser beam.

2 Claims, 7 Drawing Sheets

LASER DIODE MODULE

This is a continuation-in-part application of PCT International Application number PCT/JP00/02414 filed Apr. 13, 2000 designating the United States for the national phase.

BACKGROUND OF THE INVENTION

1. Field of the Invention

The present invention relates to a laser diode module.

2. Description of the Related Art

A conventional laser diode module has a structure as shown in FIGS. 8 to 10, for example.

In the laser diode module 1 shown in FIGS. 8 to 10, a thermo electrical cooler (TEC) 3, a base 4, a heatsink 5, a laser diode (LD) chip 6 and an optical fiber 7 are housed in a package 2.

The TEC 3 is placed on a bottom plate 2a of the package 2, and the base 4 is fixed on a substantially central portion of an upper mounting surface 3a of the TEC for mounting thereon optical components such as the LD chip 6. As shown in the figures, the LD chip 6 is fixed on the base 4 with the heatsink 5 interposed therebetween, and the optical fiber 7 is also fixed on the base with two fixing members 8 interposed therebetween. The optical fiber 7 is a lensed optical fiber having a lensed portion 7a formed as optical coupling means at one end thereof facing the LD chip 6, and a ferrule 7b is attached to a portion of the fiber corresponding in position to the fixing members 8. The other end portion of the optical fiber 7 is extended to the outside of the module through an outlet portion 2c formed in a peripheral wall 2b of the package 2.

The laser diode module 1 has a temperature sensor (not shown) arranged at a suitable location within the package 2 for detecting the temperature of the mounting surface 3a of the TEC 3. In accordance with the temperature detected by the temperature sensor of the module 1, the operation of the TEC 3 is controlled externally by control means, not shown.

A cover 2d is normally attached to the package 2 from above the peripheral wall 2b, as shown in FIG. 8; however, in order to show the interior of the package, the cover is omitted from FIG. 9, as well as from FIGS. 2 and 7 explained later.

In the conventional laser diode module 1, to stabilize temperature dependent optical characteristics of the LD chip 6 against variations in environmental temperature and heat generated by the LD chip 6 during operation thereof, the temperature of the LD chip 6 is controlled to a predetermined temperature by the TEC 3. Especially, the temperature of the mounting surface 3a of the TEC 3 on which the LD chip 6 is mounted is controlled to a predetermined temperature.

As the temperature of the mounting surface 3a of the TEC 3 increases during operation due to heat generated by the LD chip 6, for example, the TEC 3 transfers heat to the lower surface thereof, to thereby keep the temperature of the mounting surface 3a at the predetermined temperature. Consequently, there occurs a large temperature difference between the mounting surface 3a and lower surface 3b of the TEC 3. Since the TEC 3 itself is thus subject to temperature change during operation, some expansion or contraction takes place inside the parts constituting the TEC 3. As a result, a change in flatness (hereinafter merely referred to as warp) such as a some warp with a level difference of the micrometer order occurs in the mounting surface 3a of the TEC 3, and warps the base 4 on which the LD chip 6 and optical fiber 7 are mounted, as shown in FIG. 10.

In FIG. 10, the warp of the TEC 3 and of the base 4 is exaggerated for the sake of illustration, and this is the case with FIGS. 3 and 4A explained later.

If such a warp is caused, the condition of optical coupling between the LD chip 6 and optical coupling means of the laser diode module 1 deteriorates. Especially, if a warp is caused along the direction of laser beam emission, the efficiency of laser beam coupling with the optical fiber 7 lowers, giving rise to a problem that adequate optical power cannot be output to the optical fiber 7.

SUMMARY OF THE INVENTION

The present invention was created in view of the above circumstances, and an object thereof is to provide a laser diode module which is capable of suppressing reduction in the efficiency of laser beam coupling with an optical fiber even in the case where a warp is caused in the mounting surface of a thermo electrical cooler on which a laser diode chip is mounted.

To achieve the above object, the present invention provides a laser diode module comprising a laser diode chip, a thermo electrical cooler for controlling temperature of the laser diode chip to a predetermined temperature, a heat sink arranged between the laser diode chip and the thermo electrical cooler for transferring heat from said laser diode chip, and an optical fiber for guiding a laser beam emitted from the laser diode chip to outside via optical coupling means, all of the laser diode chip, the thermo electrical cooler, the heat sink and the optical fiber being housed in a package, wherein the heat sink and the optical coupling means are mounted directly or indirectly on a mounting surface of the thermo electrical cooler, and the laser diode chip and the optical coupling means are located on an identical side of the mounting surface along an emitting direction of the laser beam, with respect to a first center line intersecting perpendicularly with a tangential plane tangent to the mounting surface of the thermo electrical cooler at a center thereof and/or a second center line passing through the center of the mounting surface of the thermo electrical cooler and perpendicular to both the first center line and an axis representative of the emitting direction of the laser beam emitted from the laser diode chip.

To achieve the above object, the present invention also provides a laser diode module comprising a laser diode chip, a thermo electrical cooler for controlling temperature of the laser diode chip to a predetermined temperature, a heat sink arranged between the laser diode chip and the thermo electrical cooler for transfering heat from the laser diode chip, and an optical fiber for guiding a laser beam emitted from the laser diode chip to outside via optical coupling means, all of the laser diode chip, the thermo electrical cooler, the heat sink and the optical fiber being housed in a package, wherein the heat sink and the optical coupling means are mounted directly or indirectly on a mounting surface of the thermo electrical cooler, and the laser diode chip and the optical coupling means are arranged in a manner such that, where an axis representative of an emitting direction of the laser beam emitted from the laser diode chip is projected onto the mounting surface of the thermo electrical cooler with use of a bundle of light rays intersecting perpendicularly with a tangential plane tangent to the mounting surface of the thermo electrical cooler at a location directly under the laser diode chip, thereby obtaining a projected line image, and also where the laser diode chip and the optical coupling means are projected onto the mounting surface with use of the bundle of light rays, thereby obtaining respective projected images, the projected images of the laser diode chip and the optical coupling means are located on the projected line image of the axis and on an identical side of the mounting surface with respect to a middle point of a line segment connecting two points at which the projected line image intersects with a contour line representative of a contour of the mounting surface.

Preferably, the laser diode chip is located closer to the center of the mounting surface of the thermo electrical cooler than the optical coupling means.

Also preferably, the optical coupling means is mounted on the thermo electrical cooler with a base interposed therebetween, and a portion of the base on which the optical coupling means is mounted partly extends beyond the mounting surface.

Further preferably, the optical coupling means is formed at an end of the optical fiber and includes a portion with an end face which is formed like a lens and on which the laser beam emitted from the laser diode chip falls.

According to the present invention, a laser diode module is provided which is capable of suppressing reduction in the efficiency of laser beam coupling with an optical fiber even in the case where a warp is caused in the mounting surface of a thermo electrical cooler on which a laser diode chip is mounted.

The center of the mounting surface of the thermo electrical cooler referred to herein represents the point of intersection of the diagonal lines in the case where the mounting surface is quadrilateral in shape, and represents the center of the circle in the case where the mounting surface is circular in shape. Also, where the mounting surface is in the form of a polygon or some other figure than quadrilateral, the center of the mounting surface denotes the point of intersection of bisectors respectively bisecting the lengths of the mounting surface along X- and Y-axis directions perpendicular to each other within the mounting surface.

The above and other objects, features and advantages of the invention will become more apparent from the following detailed description taken in connection with the accompanying drawings.

DETAILED DESCRIPTION OF THE PREFERRED EMBODIMENTS

Figure 1:
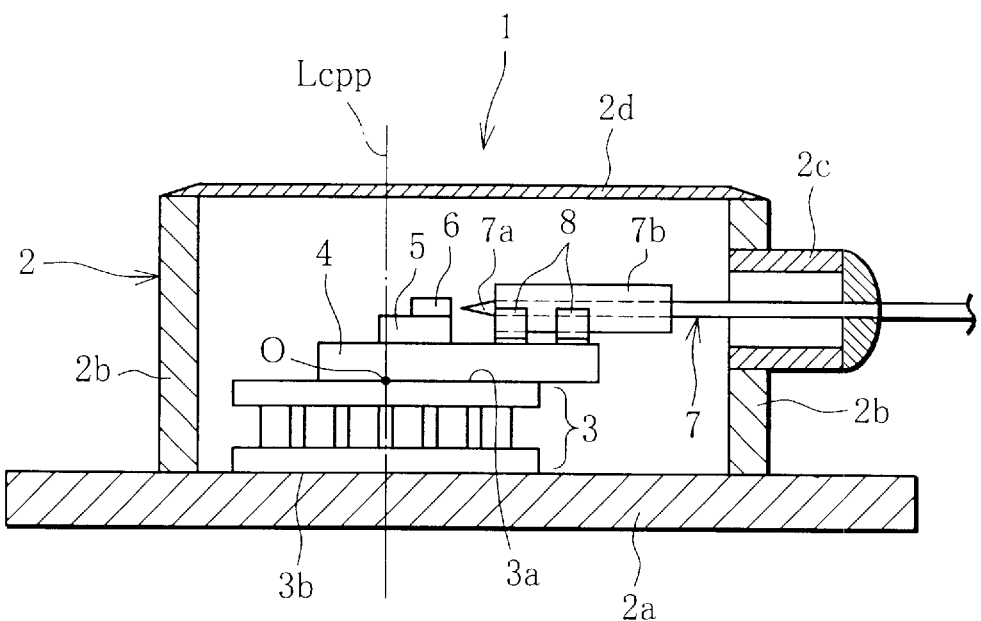
FIG. 1 is a sectional view of a laser diode module according to a first embodiment of the present invention.

Embodiments of the present invention will be hereinafter described in detail with reference to FIGS. 1 through 7.

A laser diode module according to the present invention is identical in structure with the conventional laser diode module, except that the LD chip and the optical coupling means are situated differently. Accordingly, identical reference numerals are used to denote elements identical with those of the conventional structure, and description of such elements is omitted.

Figure 2:
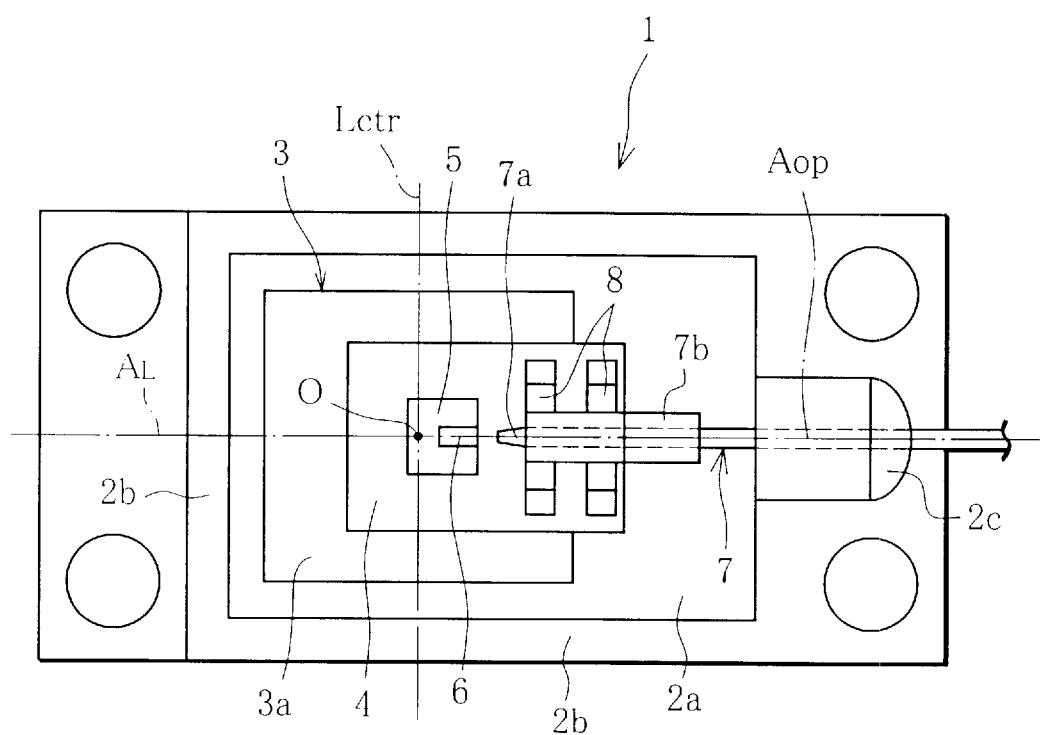
FIG. 2 is a plan view of the laser diode module shown in FIG. 1.
Figure 3:
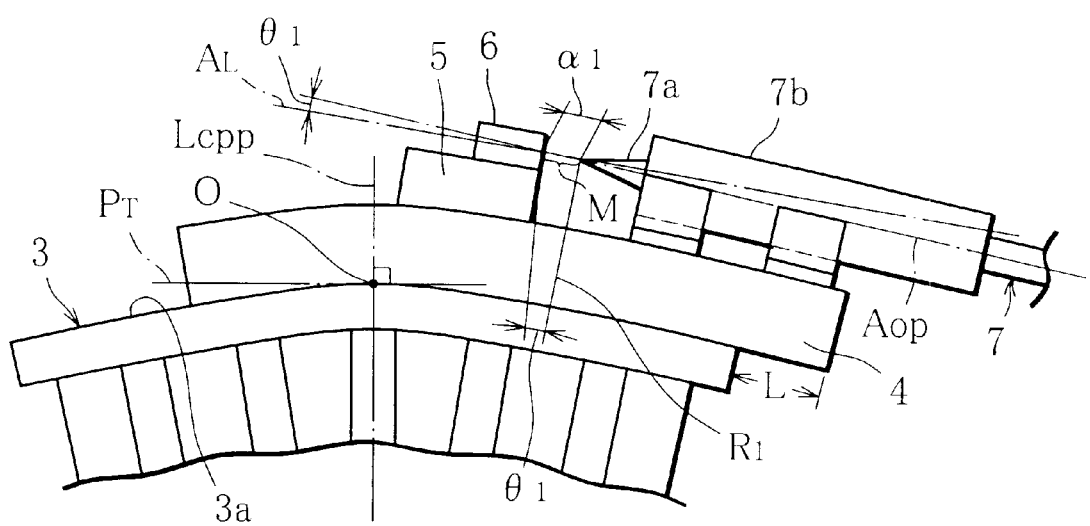
FIG. 3 is an enlarged side view of the laser diode module of FIG. 1, illustrating the arrangement of a laser diode chip and optical coupling means with respect to a center line of a thermo electrical cooler.

FIGS. 1 to 3 illustrate a laser diode module 1 according to a first embodiment.

A center line $L_{cpp}$ shown in FIGS. 1 and 3 is a straight line intersecting perpendicularly with a tangential plane $P_T$ (see FIG. 3) which is tangent to the mounting surface 3a of the TEC 3 at a center O thereof. A center line $L_{ctr}$ shown in FIG. 2 is a straight line passing through the center O of the mounting surface 3a and perpendicular to both the center line $L_{cpp}$ and an axis (hereinafter referred to as the "optical axis of the laser beam") $A_L$ representative of the emitting direction of a laser beam emitted from the LD chip 6. The center of the mounting surface 3a denotes herein the point of intersection of the diagonal lines of a quadrilateral formed by contour lines $S_a$, $S_b$, $S_c$ and $S_d$, described later, of the mounting surface 3a.

The laser diode module 1 of this embodiment is characterized in that the LD chip 6 and the lensed portion 7a of the optical fiber 7, which serves as the optical coupling means, are located on the same side of the mounting surface with respect to the center line $L_{cpp}$ and/or the center line $L_{ctr}$ as shown in FIGS. 1 to 3, that is, on the right-hand side of the mounting surface, as viewed in the figures, with respect to the center lines $L_{cpp}$ and $L_{ctr}$. The center line $L_{ctr}$ intersects perpendicularly with a plane containing the optical axis $A_L$ of the laser beam and the center line $L_{cpp}$.

Figure 4A:
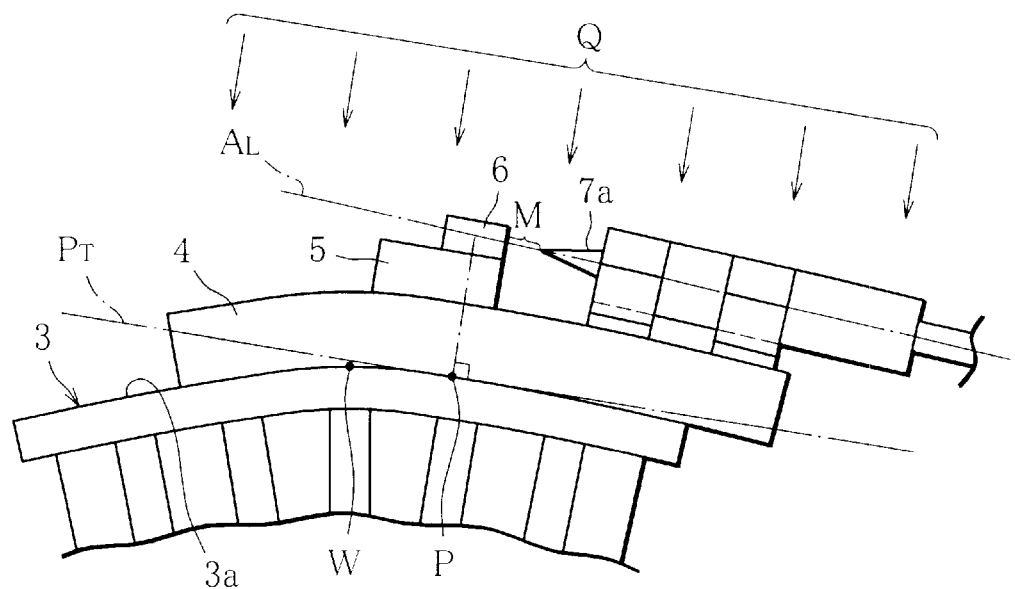
FIGS. 4A and 4B are a side view and a plan view, respectively, illustrating the arrangement of the laser diode chip and the optical coupling means on the thermo electrical cooler observed from a different viewpoint than that of FIG. 3.
Figure 4B:
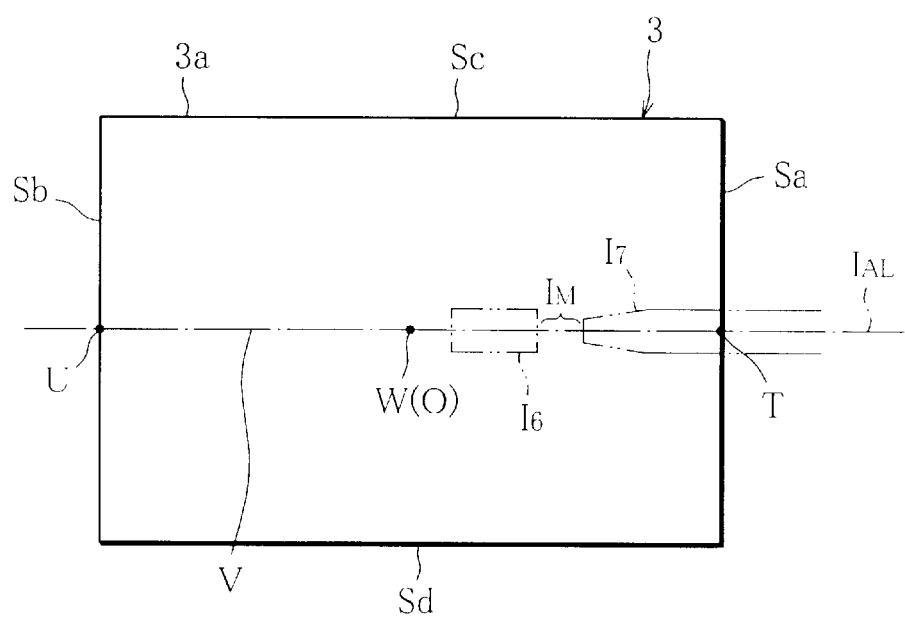

The feature of the laser diode module 1 according to this embodiment will be explained from a different point of view. Let us suppose an imaginary bundle Q of light rays perpendicular to a tangential plane $P_T$ which is tangent to the mounting surface 3a at a point P on the mounting surface 3a directly under the center of the LD chip 6, as shown in FIGS. 4A and 4B. Assuming that the optical axis $A_L$ of the laser beam is projected onto the mounting surface 3a of the TEC 3 with the use of the bundle Q of light rays, then a projected image $I_{AL}$ is formed. The projected image $I_{AL}$ intersects with the two contour lines $S_a$ and $S_b$, among the contour lines $S_a$, $S_b$, $S_c$ and $S_d$ of the mounting surface 3a of the TEC 3, at two points T and U, thus forming a line segment V connecting the two points T and U and having a middle point W. Also, where the LD chip 6 and the optical fiber 7 including the lensed portion 7a are projected onto the mounting surface 3a with the use of the bundle Q of light rays, a projected image $I_6$ of the LD chip 6 and a projected image $I_7$ of the optical fiber 7 are formed.

In this case, the LD chip 6 and the lensed portion 7a of the laser diode module 1 are arranged such that the projected image $I_6$ of the LD chip 6 and the projected image $I_7$ of the optical fiber 7 are located on the projected image $I_{AL}$ and also on the same side (in the figures, on the right-hand side) of the mounting surface 3a with respect to the middle point W of the line segment V.

To put it in other words, assuming that a line segment M connecting a laser beam emission point on the emission end face of the LD chip 6 and a laser beam receiving point on the end face of the lensed portion 7a is projected onto the mounting surface 3a of the TEC 3 with the use of the bundle Q of light rays, a projected image $I_M$ of the line segment M is completely included in either of the opposite sides of the line segment V divided by the middle point W, as shown in FIGS. 4A and 4B.

In the laser diode module 1 of this embodiment, the optical fiber 7 is arranged such that, where an optical axis $A_{op}$ of the optical fiber 7 is projected onto the mounting surface 3a of the TEC 3 with the use of the bundle Q of light rays, a projected image thereof coincides with the projected image $I_{AL}$, as shown in FIG. 4B. However, in order that the image of the optical axis $A_{op}$ projected onto the mounting surface 3a of the TEC 3 with the use of the bundle Q of light rays may not coincide with the projected image $I_{AL}$ to thereby prevent light from the end face of the optical fiber 7 from returning to the LD chip 6, for example, the LD chip 6 and the optical fiber 7 may be arranged such that the optical axis $A_L$ of the laser beam emitted from the LD chip 6 and the optical axis $A_{op}$ of the optical fiber 7 may be slightly shifted relative to each other within a plane parallel to the tangential plane $P_T$ tangent to the mounting surface at the point P.

Also, the laser diode module 1 uses the TEC 3 whose mounting surface 3a is in the form of a rectangle defined by the contour lines $S_a$, $S_b$, $S_c$ and $S_d$. In the laser diode module 1, therefore, the middle point W coincides with the center O of the mounting surface 3a of the TEC 3, and the center lines $L_{cpp}$ and $L_{ctr}$ passes through the center O and the middle point W.

Thus, the positional relationship of the LD chip 6 and the lensed portion 7a relative to the center O and the middle point W can be explained in the same manner as the positional relationship of the LD chip 6 and the lensed portion 7a relative to the center lines $L_{cpp}$ and $L_{ctr}$. Accordingly, only the positioning of the LD chip 6 and the lensed portion 7a relative to the center lines $L_{cpp}$ and $L_{ctr}$ will be explained, and explanation of the positioning of the LD chip 6 and the lensed portion 7a relative to the center O and the middle point W is omitted.

In the laser diode module 1 of the present invention, the LD chip 6 and the lensed portion 7a are positioned in the aforementioned manner, whereby advantages can be obtained for reasons stated below.

Figure 5:
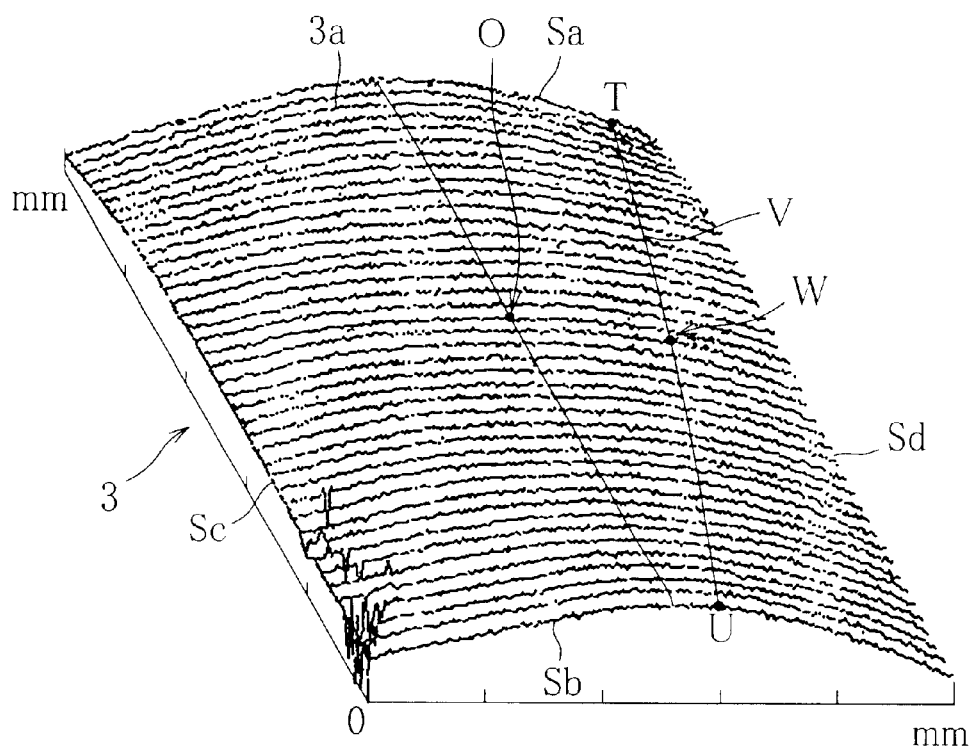
FIG. 5 is a perspective view showing results of measurement of a warp of a thermo electrical cooler.

FIG. 5 illustrates, in perspective (in three-dimensional form), the measurement results of a warp of the mounting surface 3a of the TEC 3, obtained at room temperature (about 25° C.) with the use of a contact-type surface roughness tester.

As shown in FIG. 5, the mounting surface 3a of the TEC 3 has a warp caused under the influence of temperature or other factors, and the degree of warping is especially great at the center O. Also, where arbitrary two points T and U on the respective contour lines $S_a$ and $S_b$ of the TEC 3 are connected to form a line segment V, the degree of warping is greatest at the middle point W on the line segment V.

Therefore, the LD chip 6 and the lensed portion 7a are arranged such that the projected image $I_6$ of the LD chip 6 and the projected image $I_7$ of the optical fiber 7 including the lensed portion 7a are located on one side of the line segment V with respect to the middle point W thereof. With this arrangement, it is possible to prevent the laser diode module 1 from being affected by a large warp at the middle point W, as distinct from the case where the LD chip 6 and the lensed portion 7a are located on respective opposite sides of the middle point W.

Let it be assumed, for example, that in the laser diode module 1 of this embodiment, a warp similar to that shown in FIG. 5 is caused in the mounting surface 3a of the TEC 3 along the emitting direction of the laser beam, as shown in FIG. 3. In FIG. 3, $\theta_1$ is an angle of intersection at which the optical axis $A_L$ of the laser beam emitted from the LD chip 6 intersects with the optical axis $A_{op}$ of the optical fiber 7, and $R_1$ is the radius of curvature of an arc touching both the optical axes $A_L$ and $A_{op}$ within a plane containing the optical axes $A_L$ and $A_{op}$.

Figure 10:
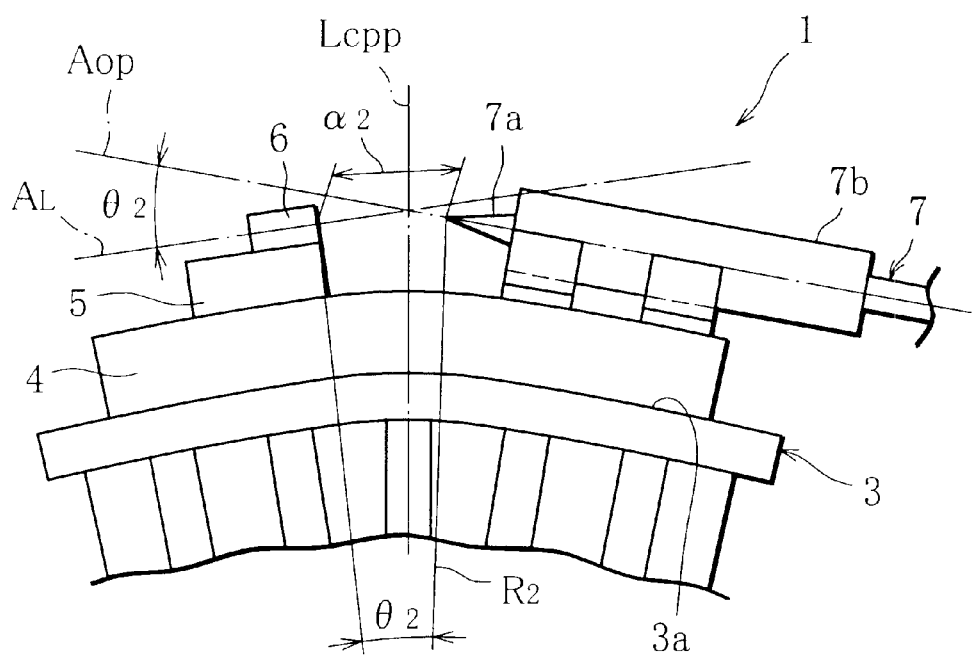
FIG. 10 is an enlarged side view of the conventional laser diode module of FIG. 8, illustrating the arrangement of a laser diode chip and optical coupling means with respect to a center line of a thermo electrical cooler.

Let it also be assumed that in the conventional laser diode module 1 shown in FIG. 10, a similar warp is caused in the mounting surface 3a of the TEC 3. In FIG. 10, $\theta_2$ denotes an angle of intersection at which the optical axis $A_L$ of the laser beam emitted from the LD chip 6 intersects with the optical axis $A_{op}$ of the optical fiber 7, and $R_2$ denotes the radius of curvature of an arc touching both the optical axes $A_L$ and $A_{op}$ within a plane containing the optical axes $A_L$ and $A_{op}$.

It is also assumed that the TECs 3 of the laser diode modules shown in FIGS. 3 and 10 are warped into exactly the same shape at an identical temperature in an identical atmosphere.

Thereupon, distances $\alpha_1$ (see FIG. 3) and $\alpha_2$ (see FIG. 10) between the opposing end faces of the LD chip 6 and the lensed portion 7a are significantly small as compared with the respective radii of curvature, $R_1$ and $R_2$, and thus can be approximated as indicated by the following equations:

$$\alpha_1 = R_1 \cdot \theta_1 \tag{Eq. 1}$$

$$\alpha_2 = R_2 \cdot \theta_2 \tag{Eq. 2}$$

When designing or producing the laser diode modules, the face-to-face distance $\alpha$ between the LD chip 6 and the optical fiber 7 is set such that $\alpha_1 = \alpha_2$ is fulfilled. However, the TECs 3 are subject to warp because some expansion or contraction takes place inside the parts constituting the TECs 3 due to their own temperature change with operation.

In this case, the TECs 3 of the laser diode modules shown in FIGS. 3 and 10 are warped into the same shape at an identical temperature in an identical atmosphere, as mentioned above. Accordingly, the radius $R_1$ of curvature shown in FIG. 3 is equal to the radius $R_2$ of curvature shown in FIG. 10. However, as is evident from the difference in the relative positioning of the LD chip 6 and the optical fiber 7, the relationship $\theta_1 < \theta_2$ holds, as shown in FIGS. 3 and 10.

Consequently, from Equations 1 and 2, $R_1 \cdot \theta_1 < R_2 \cdot \theta_2$, that is, $\alpha_1 < \alpha_2$, holds.

Due to such warping of the TECs 3, the face-to-face distances $\alpha$ of the laser diode modules change with use, causing a relative shift of the optical axes. With the arrangement of the laser diode module according to the present invention, however, change of the face-to-face distance a is small, namely, $\alpha_1 < \alpha_2$, compared with the conventional laser diode module.

As is clear from above, the laser diode module 1 of the present invention, shown in FIG. 3, undergoes a small relative shift of the optical axes, compared with the conventional laser diode module shown in FIG. 10, whereby reduction in the coupling efficiency can be suppressed when the laser beam emitted from the LD chip 6 falls upon the optical fiber 7.

In addition, since the face-to-face distance $\alpha_1$ in the laser diode module of this embodiment is not affected by a large warp at the center O of the mounting surface 3a of the TEC 3, it can be said that the temperature dependence of the face-to-face distance $\alpha_1$, that is, the temperature-dependent variation of the face-to-face distance, is smaller than in the case of the face-to-face distance $\alpha_2$ of the conventional laser diode module.

For the reasons stated above, the advantage of the present invention can be achieved. More specifically, with the arrangement of this embodiment in which the LD chip 6 and the lensed portion 7a are located on the right-hand side of the mounting surface, as viewed in the figures, with respect to the center lines $L_{cpp}$ and $L_{ctr}$, reduction in the optical coupling efficiency can be suppressed when the laser beam emitted from the LD chip 6 falls upon the lensed portion 7a.

In the laser diode module 1 of this embodiment, the LD chip 6 and the lensed portion 7a are located on the same side of the mounting surface 3a of the TEC 3, and thus may alternatively be located on the left-hand side of the mounting surface, as viewed in the figures, with respect to the center lines $L_{cpp}$ and $L_{ctr}$.

However, the LD chip 6 should desirably be located on the right-hand side of the upper mounting surface 3a of the TEC 3 with respect to the center lines $L_{cpp}$ and $L_{ctr}$, as in this embodiment, that is, on the side closer to the center O of the mounting surface 3a of the TEC 3 than the lensed portion 7a. This is because heat generated from the LD chip 6 can be effectively diffused to the entire upper mounting surface 3a of the TEC 3, compared with the case where the LD chip 6 is located on the left-hand side of the mounting surface. Consequently, the heat transfer characteristic of the TEC 3 improves, thus ensuring high output characteristics, stable optical output, etc. of the laser diode module. Also, the LD chip 6 and the optical fiber 7 can be placed while making good use of the space on the mounting surface 3a of the TEC 3.

In this embodiment, the optical coupling means, which is optically coupled with the LD chip 6, is the lensed portion 7a which is formed like a lens at the laser beam-receiving end face of the optical fiber 7, as shown in FIGS. 1 to 3. In the case of an arrangement like this wherein the LD chip 6 is directly optically coupled with the lensed portion 7a formed at the end face of the optical fiber 7, the positioning accuracy of these optical components needs to be extremely high, compared with the case of optical coupling using an intervening discrete lens (it is said that the positioning accuracy needs to be increased by about ten times). Accordingly, the present invention can be very effectively applied to this type of laser diode module in which the lensed portion 7a and the LD chip 6 are directly optically coupled with each other, because adverse influence of the warp of the TEC 3 is lessened and also high positioning accuracy of the optical components is ensured.

Further, in this embodiment, the base 4 on which the heatsink 5 and the optical fiber 7 are mounted is fixed on the mounting surface 3a in a manner such that a portion thereof, or more specifically, a portion thereof on which the optical fiber 7 is mounted, extends rightward in the direction of the optical axis $A_{op}$, as viewed in FIG. 3, and partly projects for a length L from the mounting surface 3a. Accordingly, with this laser diode module 1, a sufficient length is provided for fixing the optical fiber 7 on the base 4.

Figure 6:
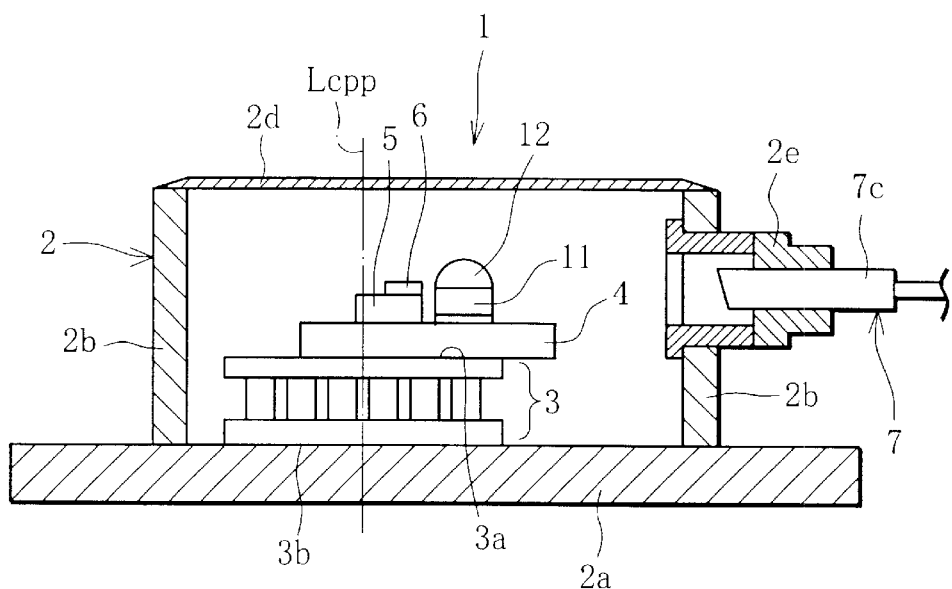
FIG. 6 is a sectional view of a laser diode module according to another embodiment of the present invention.
Figure 7:
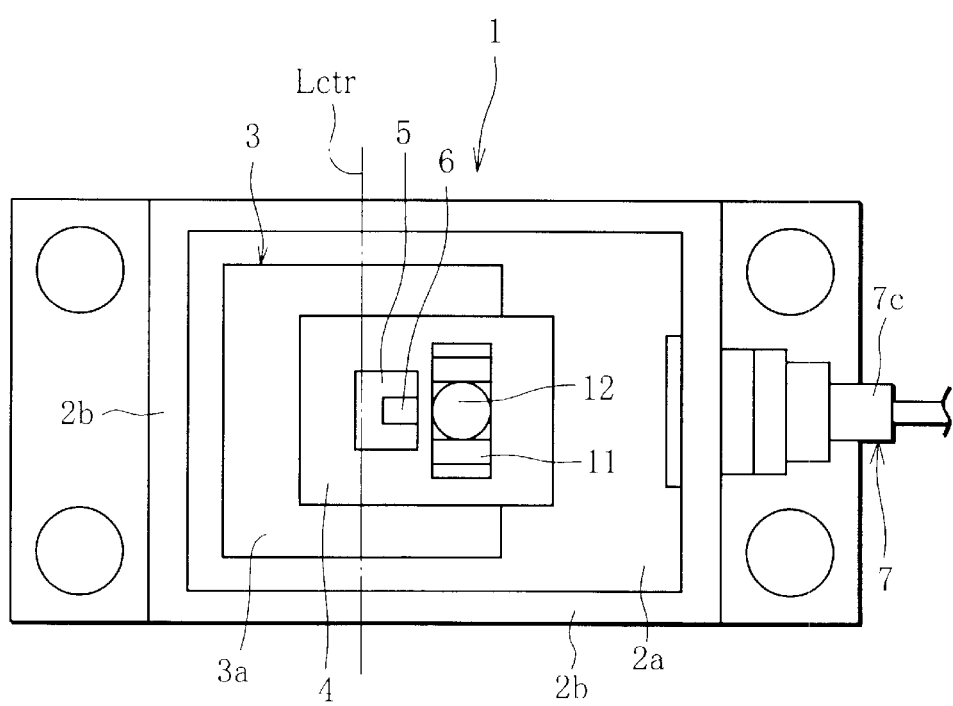
FIG. 7 is a plan view of the laser diode module shown in FIG. 6.
Figure 8:
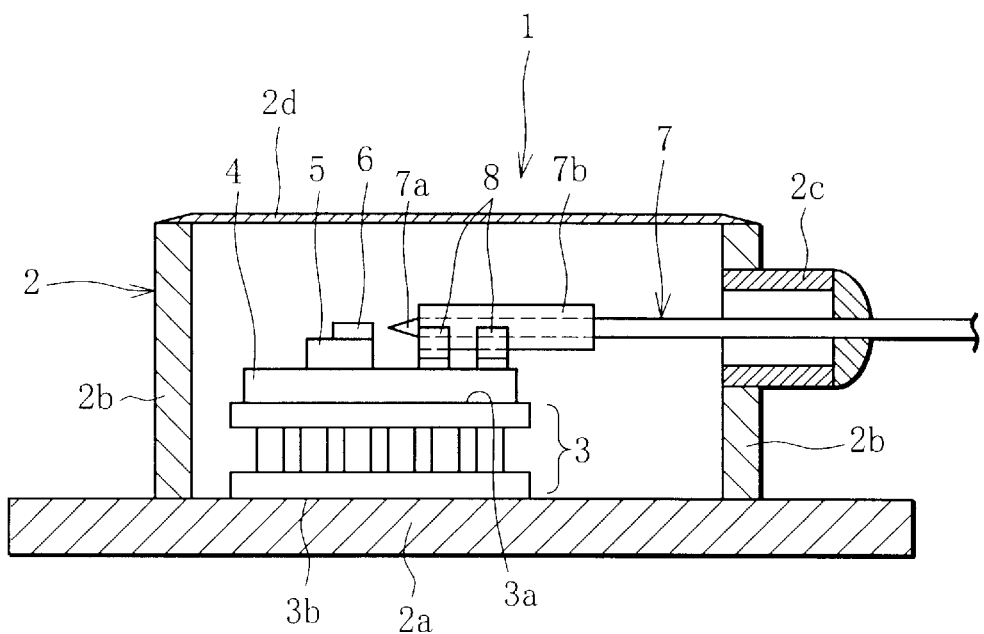
FIG. 8 is a sectional view of a conventional laser diode module.
Figure 9:
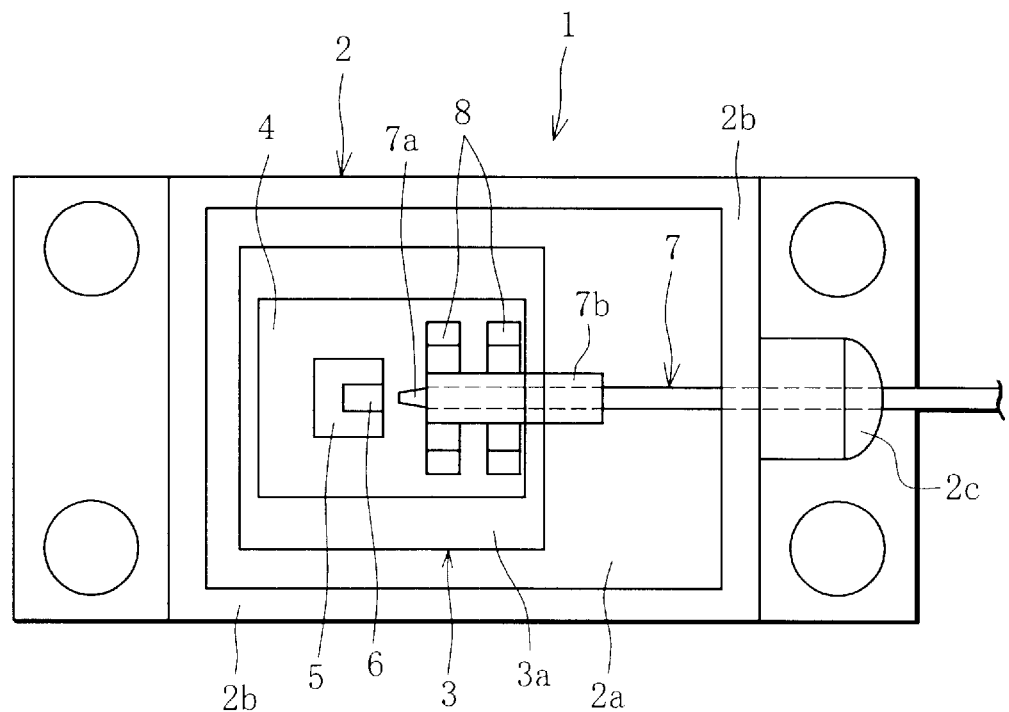
FIG. 9 is a plan view of the laser diode module shown in FIG. 8.

Referring now to FIGS. 6 and 7, a laser diode module according to another embodiment of the present invention will be described. In the laser diode module 1 shown in FIGS. 6 and 7, the LD chip 6 is located on the right-hand side of the mounting surface 3a of the TEC 3, as viewed in the figures, with respect to the center lines $L_{cpp}$ and $L_{ctr}$.

Also, the optical fiber 7 has a ferrule 7c attached to one end portion thereof, and the ferrule 7c is held by a holding part 2e attached to the peripheral wall 2b of the package 2 such that the ferrule faces the LD chip 6. The other end portion of the optical fiber is extended to the outside of the package 2 through the holding part 2e attached to the peripheral wall 2b. As the optical coupling means for optical coupling between the LD chip 6 and the optical fiber 7, a spherical lens 12 is used which is fixed on the base 4 with a fixing member 11 interposed therebetween at a location adjacent to the heatsink 5. Instead of the spherical lens 12, various other optical lenses such as an aspherical lens or rod lens may be used.

Also with this laser diode module 1 using the spherical lens 12, reduction in the coupling efficiency can be suppressed when the laser beam emitted from the LD chip 6 is converged by the spherical lens 12 and then made to enter the optical fiber 7.

In the laser diode modules of the above embodiments, the base 4 is fixed on the TEC 3, and the heatsink 5 is mounted indirectly on the TEC. Similarly, the optical fiber 7 having the lensed portion 7a as the optical coupling means is indirectly mounted on the TEC 3 with the use of the fixing members 8 or the spherical lens 12 as the optical coupling means is mounted indirectly on the TEC with the use of the fixing member 11. The base 4 is, however, used as a thermal capacitance and also as a member for mounting various components on the mounting surface 3a of the TEC 3. Accordingly, the base 4 may be omitted, if necessary, so that the heatsink 5 may be directly mounted on the mounting surface 3a of the TEC 3, and also that the optical fiber 7 having the lensed portion 7a as the optical coupling means or the spherical lens 12 as the optical coupling means may be directly mounted on the mounting surface of the TEC with the use of the fixing members 8 or the fixing member 11.

In the above embodiments, one set of LD chip 6 and lensed portion 7a is mounted on the TEC 3, but the present invention can also be applied to a module type in which a plurality of sets of LD chip 6 and lensed portion 7a are mounted on the TEC 3.

Also, in the foregoing embodiments, the mounting surface 3a of the TEC 3 is rectangular in shape, but the mounting surface 3a may be of any desired shape such as a circle or some other polygon than quadrilateral.

The manner of how the TEC 3 is warped is also affected by the materials of the parts constituting the TEC 3 and the materials of the package and other members. Accordingly, the TEC may be warped in a direction opposite to that shown in FIG. 3 (a downwardly convex warp may be caused), depending upon the materials used and the environmental temperature; however, even in the case where the TEC is warped in the opposite direction, the same advantage as described above can be obtained by the present invention.

What is claimed is:

1. A laser diode module comprising:
   a laser diode chip for emitting a laser beam therefrom;
   a thermo electrical cooler for controlling a temperature of said laser diode chip to a predetermined temperature, and said thermo electrical cooler having a mounting surface with a center thereof;
   a heat sink mounted on said mounting surface to be arranged between said laser diode chip and said thermo electrical cooler for transferring heat from said laser diode chip to said thermo electrical cooler;
   an optical fiber for guiding the laser beam to an outside of the module, the optical fiber having an end surface thereof;

optical coupling means for optically coupling the laser diode and the optical fiber, and focusing the laser beam emitted from the laser diode on the end surface of the optical fiber; and a package for housing all of said laser diode chip, said thermo electrical cooler, said heat sink, and said end surface of the optical fiber;

said heat sink, said optical coupling means and said end surface of the optical fiber being mounted directly or indirectly on said mounting surface so that said laser diode chip, said optical coupling means and said end surface of the optical fiber are located on an identical side of said mounting surface along an emitting direction of said laser beam, with respect to a plane perpendicularly bisecting said mounting surface, and said laser diode chip is located closer to the center of said mounting surface than said optical coupling means and said end surface of the optical fiber, and said optical coupling means being formed on said end surface of the optical fiber and including a portion with an end face which is formed like a lens and on which the laser beam emitted from said laser diode chip falls.

2. The laser diode module according to claim 1, further comprising a base interposed between said mounting surface, and said optical means and said end of the optical fiber, for mounting said optical means and said end surface of the optical fiber, said base having a portion which extends beyond said mounting surface.

* * * * *